United States Patent
Takayama

(10) Patent No.: US 7,257,139 B2
(45) Date of Patent: Aug. 14, 2007

(54) SEMICONDUCTOR LASER DEVICE AND OPTICAL PICKUP APPARATUS USING THE SAME

(75) Inventor: Toru Takayama, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 180 days.

(21) Appl. No.: 11/038,702

(22) Filed: Jan. 20, 2005

(65) Prior Publication Data

US 2005/0163181 A1 Jul. 28, 2005

(30) Foreign Application Priority Data

Jan. 23, 2004 (JP) ............................. 2004-016102

(51) Int. Cl.
*H01S 5/00* (2006.01)

(52) U.S. Cl. .................................. 372/43.01; 372/45.01

(58) Field of Classification Search ............... 372/46.01
See application file for complete search history.

(56) References Cited

U.S. PATENT DOCUMENTS

| | | | |
|---|---|---|---|
| 6,075,801 A | 6/2000 | Tamanuki | |
| 6,104,738 A | 8/2000 | Kitoh et al. | |
| RE37,051 E * | 2/2001 | Welch et al. | 372/50.22 |
| 6,459,840 B1 | 10/2002 | Sato et al. | |
| 6,518,159 B1 | 2/2003 | Tsunoda | |
| 6,928,097 B2 | 8/2005 | Chida | |
| 2003/0031222 A1 | 2/2003 | Balsamo et al. | |
| 2003/0128729 A1 | 7/2003 | Matsumura | |

FOREIGN PATENT DOCUMENTS

| | | |
|---|---|---|
| JP | 8-340147 | 12/1996 |
| JP | 9-307181 | 11/1997 |
| JP | 2001-196694 | 7/2001 |
| JP | 2000-357842 | 12/2002 |
| JP | 2000-066046 | 3/2003 |
| JP | 2003-101139 | 4/2003 |
| JP | 2004235396 * | 8/2004 |

OTHER PUBLICATIONS

Notification of reasons for refusal; JP application No. 2004-111438.
"Semiconductor Laser", Osmsha, 1st edition, pp. 238, 1994, Kenichi IGA; with partial translation.

* cited by examiner

*Primary Examiner*—Dung (Michael) T. Nguyen
(74) *Attorney, Agent, or Firm*—Hamre, Schumann, Mueller & Larson, P.C.

(57) ABSTRACT

A semiconductor laser device has a striped structure for injecting carriers and includes a first electrically-conductive cladding layer, an active layer, and a second electrically-conductive cladding layer that are formed on a substrate. A width of the stripe changes along a resonator direction, a difference between L1 and Lt is within 200 μm, and Rf<Rr, where L1 is a distance from a front end face to a position at which the width of the stripe is minimal, L is a length of a resonator of the semiconductor laser device, Rf is a reflectivity of the front end face, Rr is a reflectivity of a rear end face, and Lt is a distance expressed by $L \times Log_e(Rf)/Log_e(Rf \times Rr)$. The saturation of a light emission efficiency is suppressed in a high power operation, allowing a stable fundamental transverse mode oscillation.

20 Claims, 10 Drawing Sheets

Front end face          Rear end face

Front end face　　　　　　　　Rear end face

Front end face　　　　　　　　Rear end face

SEMICONDUCTOR LASER DEVICE AND OPTICAL PICKUP APPARATUS USING THE SAME

BACKGROUND OF THE INVENTION

1. Field of the Invention

The present invention relates to a semiconductor laser device in which the saturation of a light emission efficiency in a high power operation is suppressed, and an optical pickup apparatus using the same.

2. Description of Related Art

A semiconductor laser device (in the following, also referred to as a semiconductor laser) is in wide use in various fields. For example, since an AlGaInP semiconductor laser emits red laser light in a wavelength band of 650 nm, it is used widely as a light source in the field of optical disk systems such as DVDs. As an exemplary structure of the semiconductor laser, a double hetero structure including an active layer and two cladding layers sandwiching the active layer, in which one of the cladding layers forms a mesa-shaped ridge is known (see JP 2001-196694 A, for example).

FIG. 10 shows an example of an AlGaInP semiconductor laser having such a structure. The composition ratio of each layer described below will be omitted. In the semiconductor laser shown in FIG. 10, an n-type GaAs buffer layer 102, an n-type GaInP buffer layer 103 and an n-type (AlGa)InP cladding layer 104 are stacked in this order on an n-type GaAs substrate 101 having a plane tilted by 15° in a [011] direction from a (100) plane as a principal plane. Furthermore, a strained-quantum well active layer 105, a p-type (AlGa)InP first cladding layer 106, a p-type (or undoped) GaInP etching stop layer 107, a p-type (AlGa)InP second cladding layer 108, a p-type GaInP intermediate layer 109 and a p-type GaAs cap layer 110 are stacked on the n-type (AlGa)InP cladding layer 104. Here, the p-type (AlGa)InP second cladding layer 108, the p-type GaInP intermediate layer 109 and the p-type GaAs cap layer 110 are formed as a ridge having a regular mesa shape on the p-type GaInP etching stop layer 107. Furthermore, an n-type GaAs current blocking layer 111 is formed on the p-type GaInP etching stop layer 107 and on the side surfaces of the ridge. A p-type GaAs contact layer 112 is stacked on the n-type GaAs current blocking layer 111 and the p-type GaAs cap layer 110 located in the upper portion of the ridge. The strained-quantum well active layer 105 includes an (AlGa)InP layer and a GaInP layer.

In the semiconductor laser shown in FIG. 10, an electric current injected from the p-type GaAs contact layer 112 is confined to the ridge portion alone by the n-type GaAs current blocking layer 111 and concentrates into the strained-quantum well active layer 105 near a bottom of the ridge. Thus, in spite of the amount of injected current being as small as several tens of mA, a population inversion state of carriers required for laser oscillation is achieved. At this time, the recombination of carriers generates light. Then, in a direction perpendicular to the strained-quantum well active layer 105, the light is confined by both of the n-type (AlGa)InP cladding layer 104 and the p-type (AlGa)InP first cladding layer 106, and in a direction parallel with the strained-quantum well active layer 105, the GaAs current blocking layer 111 absorbs the generated light, thereby performing light confinement. Consequently, when the gain obtained by the injected current exceeds the loss in a waveguide in the strained-quantum well active layer 105, laser oscillation occurs.

In such a semiconductor laser, it is desired that highest possible light output should be achieved for rewriting an optical disk at a high speed. For example, in order to achieve at least a quad-speed rewriting for a DVD optical disk, a light output as high as 100 mW or more is required. For obtaining such a high output power, it is necessary to prevent a COD (catastrophic optical damage), in which an end face of a semiconductor laser is melted down and broken by its own light output at the time of high power operation. The COD is prevented effectively by reducing a light density inside the end face of a resonator of the laser so as to suppress heat generation. For this purpose, coating a front end face of the semiconductor laser for extracting laser light with a dielectric such as $SiO_2$, $Al_2O_3$ or amorphous Si so as to reduce its reflectivity is effective.

In general, the reflectivity of the end face of the resonator of AlGaInP and AlGaAs semiconductor lasers is about 30% when the end face is not coated. In this case, about 30% of the laser light is reflected by the resonator end face and fed back to the inside of the resonator, while about 70% of the laser light is extracted from the front end face. In contrast, when the front end face is coated with a dielectric film to have a reflectivity of 10%, 10% of the laser light is reflected by the resonator end face and fed back to the inside of the resonator, while 90% thereof is extracted from the front end face. In other words, in the case where the same light output is extracted from the front end face, when the reflectivity of the front end face is reduced to ⅓, it also is possible to reduce the light density of the resonator end face to ⅓. Accordingly, reducing the reflectivity of the front end face increases a COD level and thus is effective in obtaining a high-power laser. Furthermore, if the reflectivity of a rear end face, which is an opposite side of the resonator face from which the laser light is extracted, is set to be high, it is possible to enhance a light extraction efficiency from the front end face of the semiconductor laser. Therefore, in a general high-power semiconductor laser, an end face coating condition of reducing the reflectivity of the front end face and increasing that of the rear end face is used widely.

As described above, in order to obtain a high-power laser, the reduction in the reflectivity of the front end face and the increase in that of the rear end face are effective in improving the COD level and the light extraction efficiency. However, when the reflectivity of the front end face is reduced excessively, the laser light that is fed back inside the resonator decreases, raising an oscillation threshold current. Also, in the case of applying the semiconductor laser to an optical disk, when the reflectivity of the front end face is low, it becomes likely that reflected light returning from the optical disk may generate noise (noise induced by returning light). Accordingly, in a high-power laser, the front end face usually is coated such that its reflectivity is about 5% to 10% so as both to achieve a high light extraction efficiency and reduce the noise induced by returning light. Further, the rear end face is coated so as to achieve a highest possible reflectivity, namely, about 95% to 100% in general.

As described above, the front end face and the rear end face of the high-power laser have considerably different reflectivities. In such cases, the distribution of the intensity of light propagating through the active layer in a resonator direction is not front-rear symmetrical with respect to the resonator but front-rear asymmetrical as shown in FIG. 2 where the front end face side has a higher intensity in light intensity distribution. FIG. 2 shows a light distribution in the resonator direction of a device whose resonator length is 1100 μm, front end face reflectivity is 7% and rear end face reflectivity is 95%, as an example.

In this case, since a more intensive stimulated emission occurs on the front end face side having a higher light intensity than on the rear end face side, more electron-hole pairs have to be injected into the active layer on the front end face side than that on the rear end face side. Especially in a high power operation, the front end face side becomes short of the electron-hole pairs in the active layer, which may cause a saturation of a light emission efficiency. This saturation of the light emission efficiency may degrade temperature characteristics of a high-power laser of 200 to 300 mW or higher, thus posing a serious problem.

SUMMARY OF THE INVENTION

It is an object of the present invention to provide a semiconductor laser device in which the saturation of a light emission efficiency is suppressed in a high power operation, allowing a stable fundamental transverse mode oscillation.

A semiconductor laser device according to the present invention has a striped structure for injecting carriers and includes a first electrically-conductive cladding layer, an active layer, and a second electrically-conductive cladding layer that are formed on a substrate.

In order to solve the above-mentioned problems, in a semiconductor laser device with a first structure, a width of the stripe changes along a resonator direction, a difference between L1 and Lt is within 200 μm, and Rf<Rr, where L1 is a distance from a front end face to a position at which the width of the stripe is minimal, L is a length of a resonator of the semiconductor laser device, Rf is a reflectivity of the front end face, Rr is a reflectivity of a rear end face, and Lt is a distance expressed by $L \times Log_e(Rf)/Log_e(Rf \times Rr)$.

In a semiconductor laser device with a second structure, the semiconductor laser device has a region in which a width of the stripe decreases continuously from a front end face to a rear end face, a difference between L1 and Lt is within 200 μm, and Rf<Rr, where L1 is a distance from the front end face to a position at which the width of the stripe is minimal in the region in which the width of the stripe decreases continuously, L is a length of a resonator of the semiconductor laser device, Rf is a reflectivity of the front end face, Rr is a reflectivity of the rear end face, and Lt is a distance expressed by $L \times Log_e(Rf)/Log_e(Rf \times Rr)$.

An optical pickup apparatus according to the present invention includes the semiconductor laser device with the above-described structure, and a light-receiving portion for receiving light that is emitted from the semiconductor laser device and then reflected.

DESCRIPTION OF THE PREFERRED EMBODIMENTS

Figure 1:
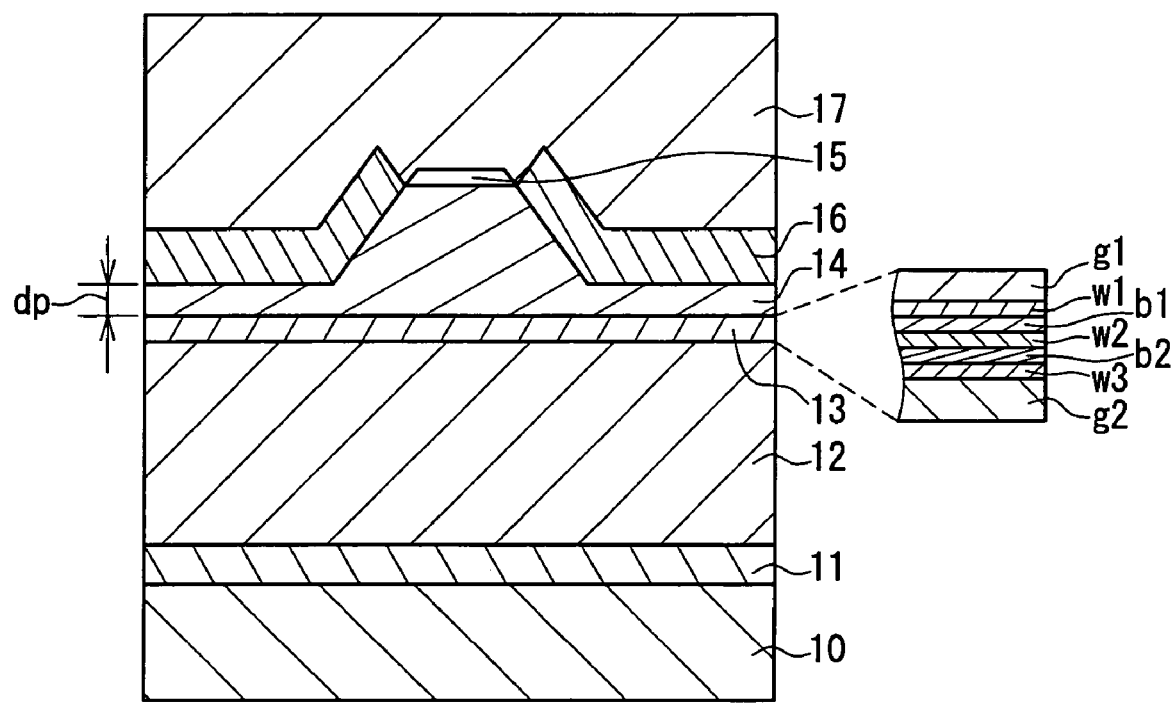
FIG. 1 is a sectional view showing a semiconductor laser device according to a first embodiment of the present invention.

With the above-described structure, the semiconductor laser device according to the present invention achieves a high thermal saturation level and is capable of a fundamental transverse mode oscillation up to a high output state.

Also, using the semiconductor laser device with the above-described structure, an optical axis of FFP is stabilized, thereby achieving an optical pickup apparatus capable of a fundamental transverse mode oscillation up to a high output state.

It is preferable that the semiconductor laser device of the present invention has regions near the front end face and the rear end face in which the width of the stripe is constant from the front end face and the rear end face to an inside of the resonator.

Also, it is preferable that L1 is substantially equal to Lt.

It also is preferable that the active layer near at least one of the front end face and the rear end face is disordered by diffusing impurities.

The optical pickup apparatus according to the present invention further can include a light-branching portion for branching the reflected light, in which the light-receiving portion receives the reflected light branched by the light-branching portion.

Also, the semiconductor laser device and the light-receiving portion can be disposed on a single supporting substrate.

Further, the semiconductor laser device can be disposed on a supporting substrate, and an optical element can be provided so as to reflect the light emitted from the semiconductor laser device in a direction normal to a surface of the supporting substrate. The optical element can be a reflecting mirror.

The following is a description of embodiments of the present invention, with reference to the accompanying drawings. In the embodiments described below, the same portions sometimes are given the same reference numerals so that the redundant description will be omitted.

First Embodiment

The structure of a semiconductor laser device (in the following, also referred to as a semiconductor laser) in the first embodiment of the present invention will be described.

FIG. 1 is a sectional view showing an example of the semiconductor laser device in the present embodiment. A semiconductor laser device shown in FIG. 1 is formed on an n-type GaAs substrate 10 having a plane tilted by 10° in a [011] direction from a (100) plane as a principal plane. An n-type GaAs buffer layer 11, an n-type (AlGa)InP first cladding layer 12, an active layer 13, a p-type (AlGa)InP second cladding layer 14 and a p-type GaInP protective layer 15 are stacked in this order on the n-type GaAs substrate 10. In this way, a double hetero structure in which the active layer 13 is sandwiched by two cladding layers 12 and 14 is formed.

Furthermore, the p-type (AlGa)InP second cladding layer 14 forms a ridge having a regular mesa shape on the active layer 13. Moreover, an n-type AlInP current blocking layer 16 is formed so as to cover side surfaces of the ridge, and a p-type GaAs contact layer 17 is stacked on the n-type AlInP current blocking layer 16 and the p-type GaInP protective layer 15 located in an upper portion of the ridge. The active layer 13 is a strained-quantum well active layer including an (AlGa)InP first guide layer g1, a GaInP first well layer w1, an (AlGa)InP first barrier layer b1, a GaInP second well layer w2, an (AlGa)InP second barrier layer b2, a GaInP third well layer w3 and an (AlGa)InP second guide layer g2. An example of the composition ratio in each of the above-mentioned layer will be described later.

In the semiconductor laser device shown in FIG. 1, an electric current injected from the p-type GaAs contact layer 17 is confined to the ridge portion alone by the n-type AlInP current blocking layer 16, whereby the current is injected in a concentrated manner into the active layer 13 near a bottom of the ridge. Therefore, a population inversion state of carriers required for laser oscillation can be realized with an injected current of about several tens of mA. At this time, light emitted by recombination of carriers is confined by both of the n-type (AlGa)InP first cladding layer 12 and the p-type (AlGa)InP second cladding layer 14 in a direction perpendicular to a principal plane of the active layer 13. On the other hand, in a direction parallel with the principal plane of the active layer 13, the light is confined by the n-type AlInP current blocking layer 16 having a smaller refractive index than the p-type (AlGa)InP second cladding layer 14. This makes it possible to provide a semiconductor laser device using a ridge as a waveguide (i.e., of a ridge waveguide type) capable of fundamental transverse mode oscillation.

Figure 2:
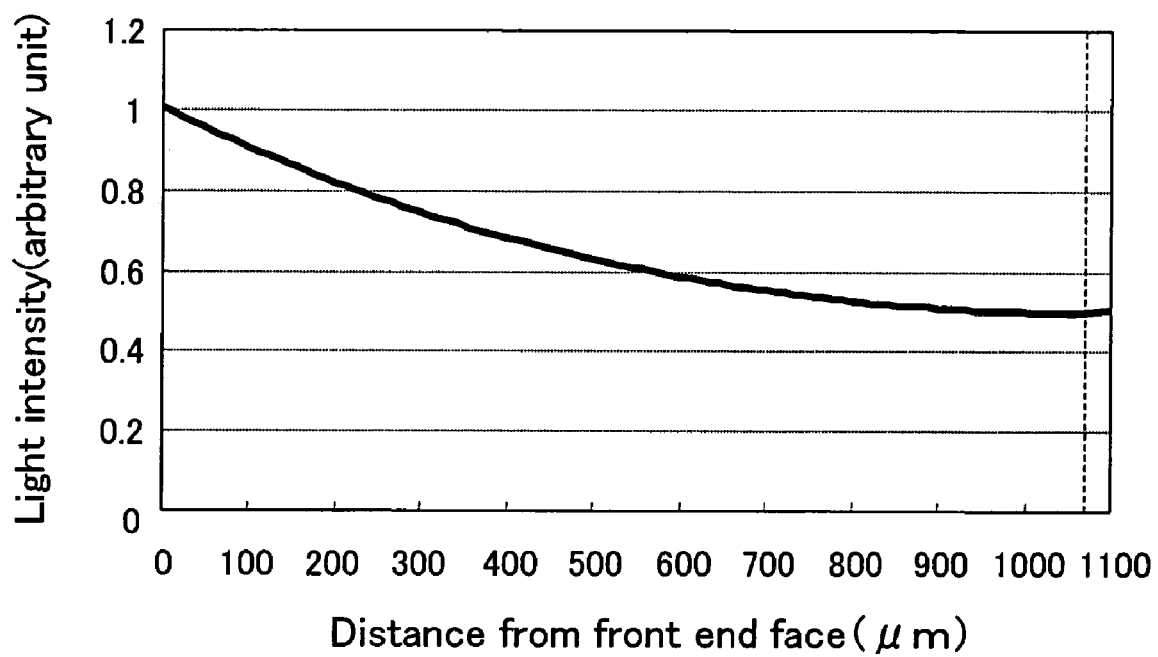
FIG. 2 shows a light intensity distribution in a resonator direction of a semiconductor laser device according to an embodiment of the present invention.

Further, the semiconductor laser device shown in FIG. 1 has a resonator length of, for example, 1100 µm for the purpose of reducing an operation current density and improving temperature characteristics. A resonator end face on the front side from which laser light is extracted is provided with a 7% low-reflectivity coating, while an end face on the rear side is provided with a 95% high-reflectivity coating. As shown in FIG. 2, the light intensity distribution in the resonator direction is front-rear asymmetrical inside the resonator, where the light intensity distribution on the front end face side is about twice as high as that on the rear end face side. In this case, the front end face portion having a higher light density needs more stimulated emission light than the rear end face portion having a lower light density. In order to generate more stimulated emission light, a larger number of electron-hole pairs are necessary in the active layer. Thus, the active layer in the front end face portion needs a larger number of electron-hole pairs than that in the rear end face portion.

If the ridge width is constant along the resonator direction, a current is injected uniformly in the resonator direction. As a result, when the light output exceeds a certain value, in a high output state, the supply of the electron-hole pairs becomes insufficient in the active layer in the front end face portion, so that the gain is saturated, since the front end face portion provided with a low-reflectivity coating needs a larger number of electron-hole pairs.

In contrast, herein, the structure will be examined in which the ridge width is changed along the resonator direction in such a manner as to increase in the portion requiring a larger number of electron-hole pairs so that more current can be injected easily. When Rf indicates the reflectivity of the front end face, Rr indicates that of the rear end face and L indicates the resonator length, a point at which the light density is smallest in the resonator direction generally is at a distance Lt expressed by $L \times Log_e(Rf)/Log_e(Rf \times Rr)$ from the front end face. For example, if a front end face of a device having a resonator length of 1100 µm is provided with 7% low-reflectivity coating and a rear end face thereof is provided with 95% high-reflectivity coating, then the light density at a distance of 1079 µm from the front end face along the resonator direction is smallest as shown in FIG. 2. The ridge width in the resonator direction is changed according to this light intensity distribution such that the ridge width decreases in keeping with the light density.

Figure 3A:
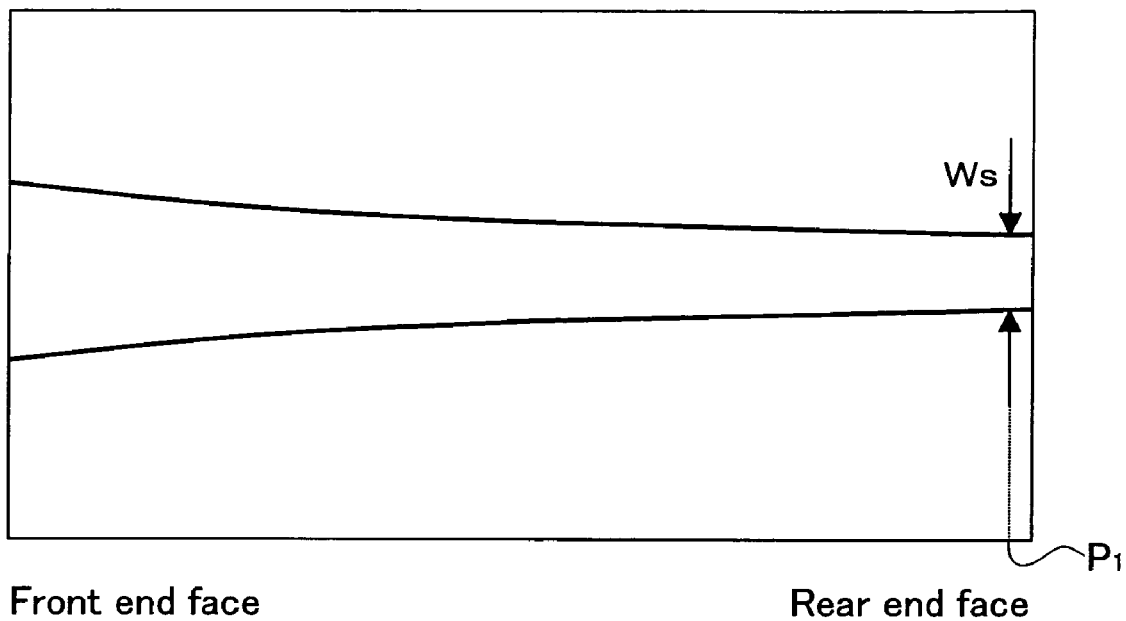
FIG. 3A shows how a bottom width of a ridge changes along a resonator direction of a semiconductor laser device in an example.
Figure 3B:
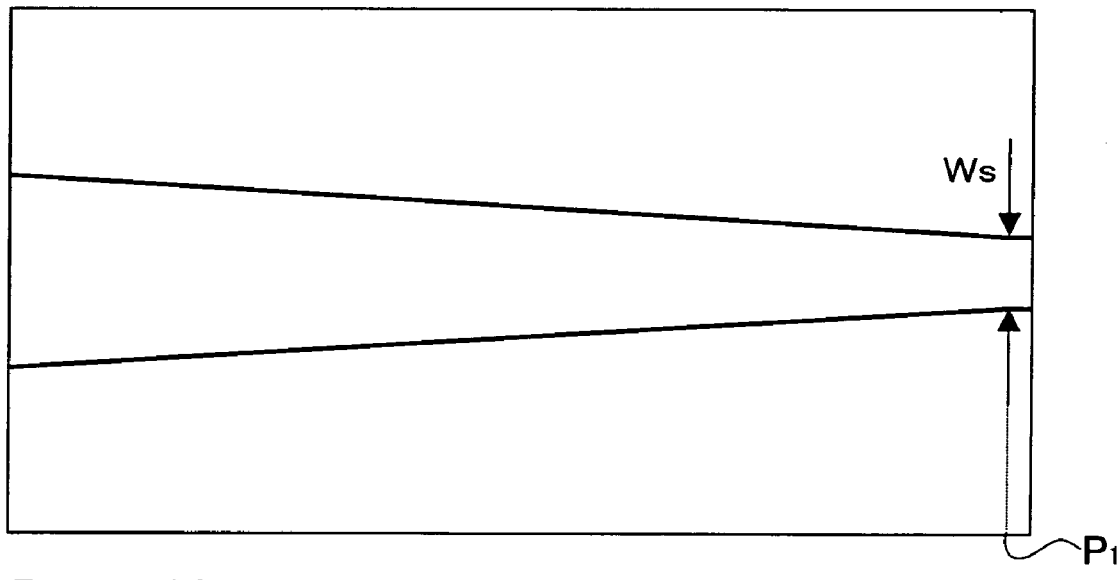
FIG. 3B shows how a bottom width of a ridge changes along a resonator direction of a semiconductor laser device in another example.

The ridge width may be changed so that a rate of change in the ridge width along the resonator direction is a differential continuation as shown in FIG. 3A, or it may be changed linearly as shown in FIG. 3B. In FIG. 3A and FIG. 3B, the ridge width on the rear end face side with respect to the position at which the light density is smallest is constant. As long as the position (P1) at which the light density is smallest, that is, the position at the distance Lt from the front end face is at a distance of not greater than 200 µm from the rear end face, the ridge width between P1 and the rear end face may be constant.

It is desirable that a distance L1 from the front end face to a position at which the width of the ridge is minimal is equal substantially to Lt. However, if a difference between L1 and Lt is within 200 µm, practically tolerable characteristics can be obtained.

In the case of producing the laser resonator by cleavage, by providing a region in which the ridge width is constant from the end face of the laser to the inside of the resonator, it becomes possible to suppress the variation in the ridge width in the laser end face portion caused by the variation in cleavage positions. Since the ridge width influences the degree of a radiation angle of laser light, it is possible to stabilize the radiation angle of the laser light by providing the region in which the ridge width is constant from the end face of the laser to the inside of the resonator. In general, the accuracy of the cleavage position is within several micrometers. Accordingly, by providing at least 5 µm of the region with constant ridge width in the laser end face portion, it becomes possible to suppress the variation in the laser radiation angle due to the variation in the cleavage positions.

Figure 4:
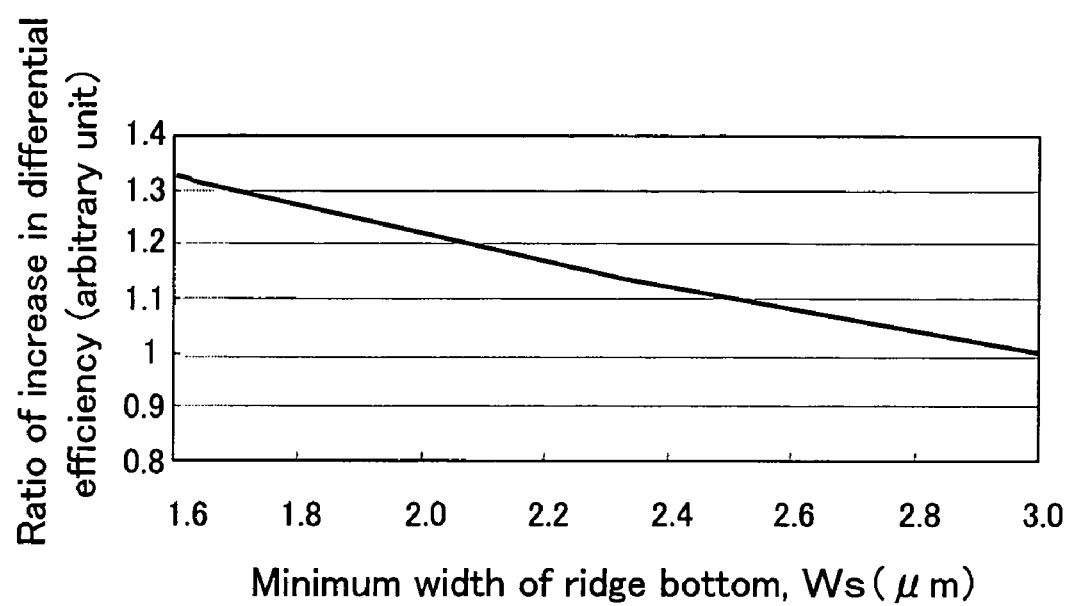
FIG. 4 shows a relationship between a minimum bottom width of the ridge and a differential efficiency in current-light output characteristics.

Now, FIG. 4 shows the change in a differential efficiency in current-light output with respect to the change in the ridge width (Ws) at the position where the light intensity in the resonator direction is smallest in the case where the ridge bottom in the front end face portion has a width of 3 µm and the front end face and the rear end face have a reflectivity of 7% and 95%, respectively. The ridge bottom in the rear end face portion is set to be the same as Ws. As shown in FIG. 4, it is found that the differential efficiency improves with a decrease in Ws.

In an example based on the present embodiment, the width of the ridge bottom in the front end face portion was set to be 3 µm, that at a distance of 1079 µm from the front end face along the resonator direction was set to be 2.3 µm, and that in the rear end face portion was set to be 2.3 µm. The ridge width was changed linearly as shown in FIG. 3B.

In the semiconductor laser device shown in FIG. 1, the thickness, the composition, the composition ratio and the electrical conductivity type of each layer can be set to any values within a usually practiced range. They may be set freely based on the characteristics required for a semiconductor laser device. For example, each layer can be set to have a thickness, a composition and a composition ratio listed below. The values inside parentheses indicate the thickness of respective layers, and the same reference numerals as in FIG. 1 are used to facilitate understanding.

Examples of the composition ratio and the thickness of each layer are as follows: n-type GaAs buffer layer 11 (0.5 µm), n-type $(Al_{0.7}Ga_{0.3})_{0.51}In_{0.49}P$ first cladding layer 12 (1.2 µm), p-type $(Al_{0.7}Ga_{0.3})_{0.51}In_{0.49}P$ second cladding layer 14, p-type $Ga_{0.51}In_{0.49}P$ protective layer 15 (50 nm) and p-type GaAs contact layer 17 (3 µm). An example of the active layer 13 is a strained-quantum well active layer including an $(Al_{0.5}Ga_{0.5})_{0.51}In_{0.49}P$ (50 nm) first guide layer g1, a $Ga_{4.8}In_{0.52}P$ (5 nm) first well layer w1, an $(Al_{0.5}Ga_{0.5})_{0.51}In_{0.49}P$ (5 nm) first barrier layer b1, a $Ga_{0.48}In_{0.52}P$ (5 nm) second well layer w2, an $(Al_{0.5}Ga_{0.5})_{0.51}In_{0.49}P$ (5 nm) second barrier layer b2, a $Ga_{0.48}In_{0.52}P$ (5 nm) third well layer w3 and an $(Al_{0.5}Ga_{0.5})_{0.51}In_{0.49}P$ (50 nm) second guide layer g2.

An example of the p-type $(Al_{0.7}Ga_{0.3})_{0.51}In_{0.49}P$ second cladding layer 14 is set to have a distance between the p-type GaInP protective layer 15 in the upper portion of the ridge and the active layer 13 is 1.2 µm and a distance dp between the ridge bottom and the active layer shown in FIG. 1 is 0.2 µm. An example of the thickness of the n-type AlInP current blocking layer 16 is 0.7 mm. In this example, the upper surface of the ridge is thinner by about 1 µm than the bottom of the ridge.

The active layer 13 is not limited to the strained-quantum well active layer as illustrated in the above example. For example, a non-strained-quantum well active layer or a bulk active layer may be used. Furthermore, there is no particular limitation on the conductivity type of the active layer 13. The active layer 13 may be of a p-type or an n-type. It also may be an undoped active layer.

Furthermore, as in the example described above, if a current blocking layer transparent to oscillating laser light is used, it is possible to reduce a waveguide loss and also lower an operation current value. In this case, the distribution of light propagating through a waveguide can penetrate the current blocking layer greatly. Therefore, it also is possible to set the difference ($\Delta n$) between the effective refractive index inside the stripe region and that outside the stripe region to be on the order of $10^{-3}$. Furthermore, $\Delta n$ can be controlled minutely by regulating the distance dp between the ridge bottom and the active layer shown in FIG. 1. In this way, it is possible to achieve a semiconductor laser device that has a lowered operation current value, and is capable of oscillating stably up to a high output state. The range of $\Delta n$ is, for example, from $3\times10^{-3}$ to $7\times10^{-3}$. In this range, the semiconductor laser device is capable of a stable fundamental transverse mode oscillation up to a high output state.

In the semiconductor laser device of the present embodiment, the difference between the minimum width of the ridge bottom and the maximum width thereof may be equal to or smaller than 0.5 µm. With such a structure, an increase in the waveguide loss accompanying the change in the light intensity distribution is suppressed, thus providing a semiconductor laser device with less waveguide loss.

Moreover, in the semiconductor laser device of the present embodiment, the active layer near the end face may be disordered by diffusing impurities. With such a structure, the band gap of the active layer near the end face can be increased, thereby obtaining an end face window structure that is more transparent to laser light. Consequently, it is possible to provide a semiconductor laser device that does not cause an end face breakage (so-called COD) easily even in a high light output state.

The impurities to be diffused may be, for example, Si, Zn, Mg or O. The amount of diffused impurities (the doping amount) ranges, for example, from $1\times10^{17}$ cm$^{-3}$ to $1\times10^{20}$ cm$^{-3}$. The impurities may be diffused in the range of, for example, 10 to 50 µm from the end face of the semiconductor laser device.

Figure 5:
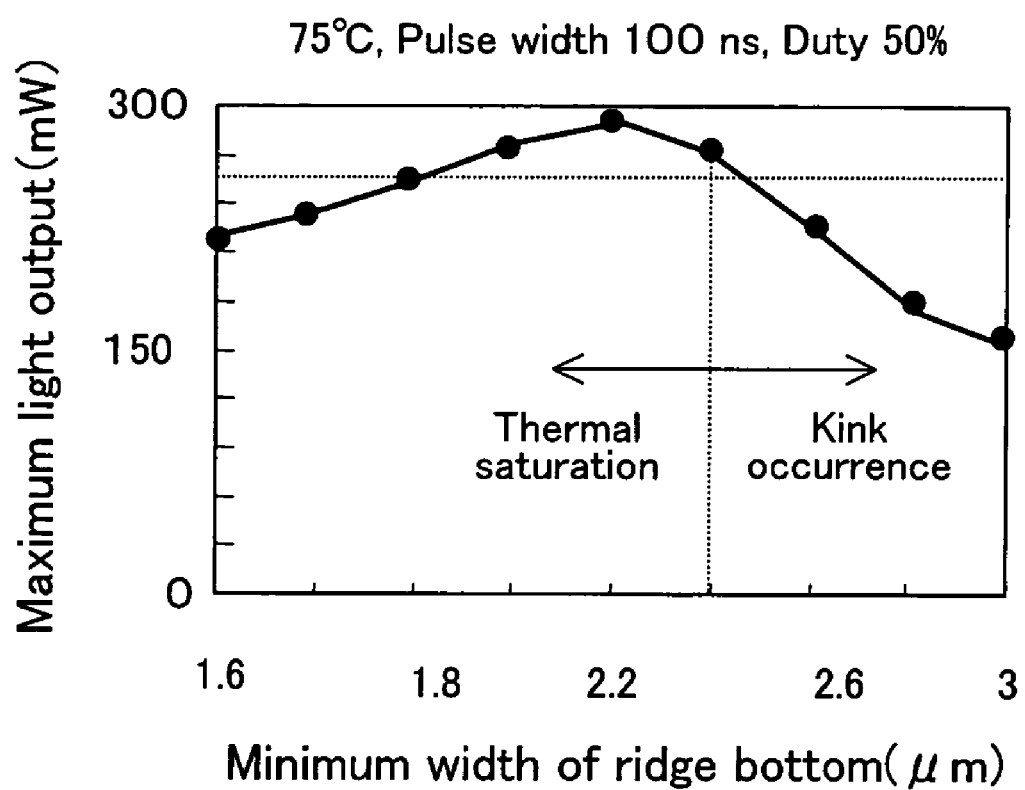
FIG. 5 shows a relationship between the minimum bottom width of the ridge and a maximum light output in a semiconductor laser device according to an embodiment of the present invention.

Next, with respect to a semiconductor laser device having a cross-sectional structure and a composition ratio that are similar to those in the example shown in FIG. 1, the relationship between a maximum light output and a smallest width of the ridge bottom at the time of pulse driving was examined. The results are shown in FIG. 5. The condition of laser light oscillation was such that the temperature of the semiconductor laser device was 75° C., the pulse width was 100 ns and the duty ratio was 50%.

As shown in FIG. 5, when the smallest width Ws of the ridge bottom exceeded 2.4 µm, the maximum light output was determined by a light output at which a kink occurred. It was also found that, as Ws increased, the light output at which kink occurred lowered. On the other hand, when Ws decreased to 2.4 µm or smaller, the light output was restricted due to thermal saturation, though the kink did not occur. It was found that, until Ws reached 2.2 µm, the light output at which the thermal saturation was caused increased. When Ws became smaller than 2.2 µm, there was a tendency for the light output at which the thermal saturation was caused to decrease owing to an increase in a differential resistance Rs. These results show that the occurrence of kink is suppressed to a practically tolerable degree when Ws ranges from 1.6 to 2.6 µm, thus achieving a semiconductor laser device with a high thermal saturation level.

In the semiconductor laser device of the present embodiment, the minimum width of the ridge bottom Ws can be set to range from 1.6 to 2.5 µm. With such a structure, it is possible to suppress the occurrence of spatial hole burning of carriers in a region where the ridge bottom is narrowest. Thus, a semiconductor laser device in which the occurrence of kink is suppressed up to a higher output level can be provided.

Furthermore, in the semiconductor laser device of the present embodiment, the largest width of the ridge bottom can be set to 2.4 to 3 µm. With such a structure, it is possible to cut off a higher-order transverse mode more effectively while suppressing an increase in the differential resistance Rs in a region where the ridge bottom is widest. Consequently, a semiconductor laser device capable of a fundamental transverse mode oscillation up to a higher output level can be provided.

Figure 6:
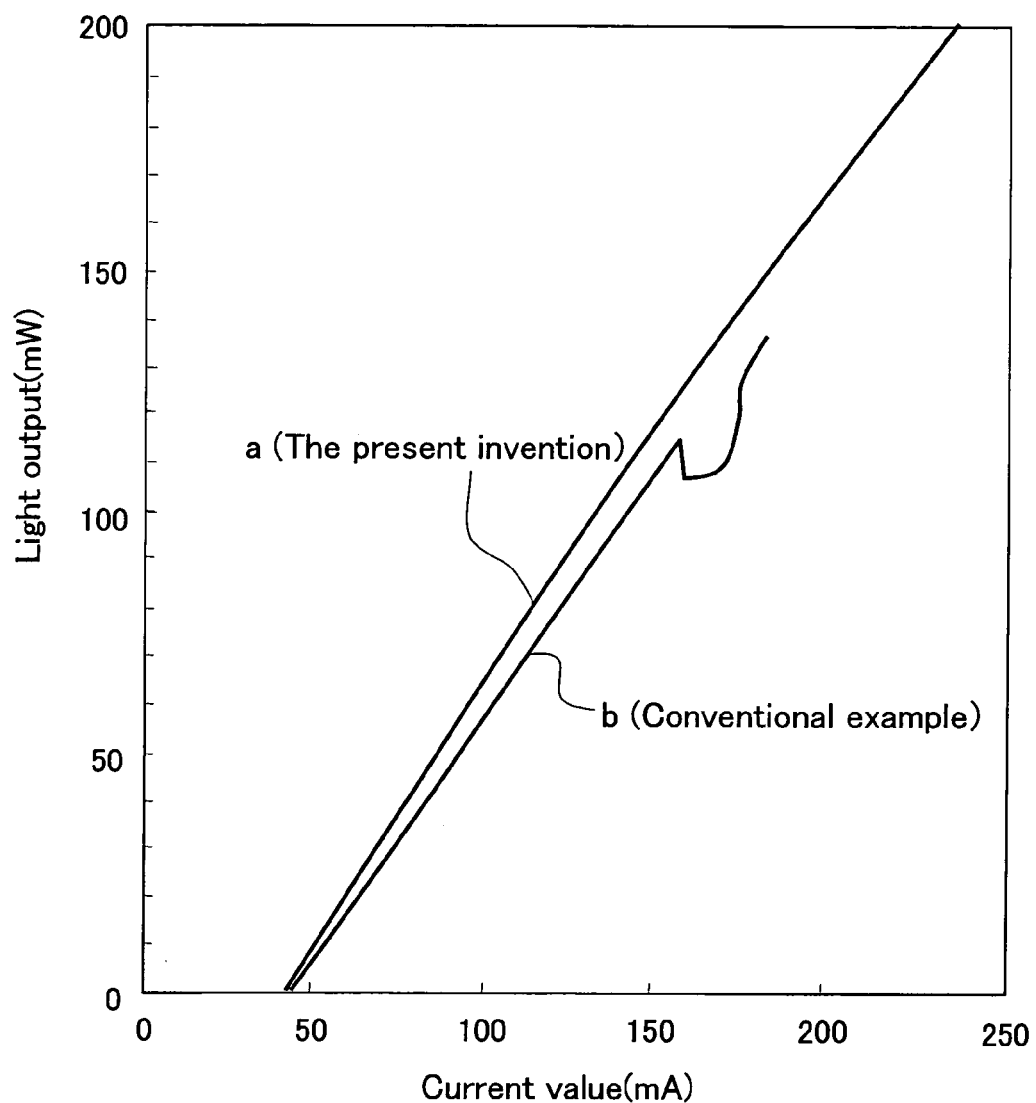
FIG. 6 illustrates an example of current-light output characteristics in the semiconductor laser device of the present invention and a conventional semiconductor laser device.

Using a line a, FIG. 6 illustrates current-light output characteristics of a semiconductor laser device in an example based on the present embodiment at room temperature in CW mode. In this figure, a line b indicates the current-light output characteristics of a conventional semiconductor laser device having a resonator length of 1100 µm and a constant ridge width of 2.8 µm along the resonator direction. In the case of the conventional semiconductor laser device, the kink occurs at about 120 mW. On the other hand, the semiconductor laser device of the example of the present invention shows current-light output characteristics with an excellent linearity up to 200 mW or more. The reasons therefor follow. In the example of the present invention, the ridge width is changed along the resonator direction in such a manner as to decrease at the position where the light intensity is minimal in the resonator direction, allowing more electron-hole pairs to be injected in a high light density portion of the active layer so that the saturation of the gain does not occur easily up to a high output state, thus achieving a high thermal saturation level. Also, the narrow portion of the ridge suppresses a higher-order transverse mode oscillation, thus suppressing the occurrence of the kink.

Now, the method for manufacturing the semiconductor laser device having the above-described structure will be described with reference to FIGS. 7A to 7F, which are sectional views showing exemplary processes of the manufacturing method.

Figure 7A:
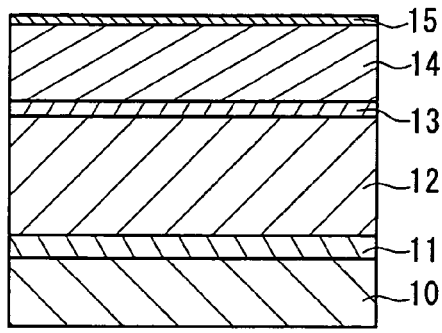
FIGS. 7A to 7F are sectional views showing a method for manufacturing the semiconductor laser device according to the first embodiment of the present invention.

First, as shown in FIG. 7A, an n-type GaAs buffer layer 11 (0.5 µm), an n-type (AlGa)InP first cladding layer 12 (1.2 µm), an active layer 13, a p-type (AlGa)InP second cladding layer 14 and a p-type GaInP protective layer 15 (50 nm) are formed on an n-type GaAs substrate 10 having a plane tilted by 10° in a [011] direction from a (100) plane as a principal plane. Numerals in the parentheses indicate the thicknesses of respective layers. Although the description of the composition ratio of each layer will be omitted here, it may be similar to that in the example illustrated in the first embodiment, for example. The active layer 13 may be similar to that in the example of the strained-quantum well active layer illustrated in the first embodiment, for example. When forming each layer, it is possible to use MOCVD or MBE, for example.

Figure 7B:
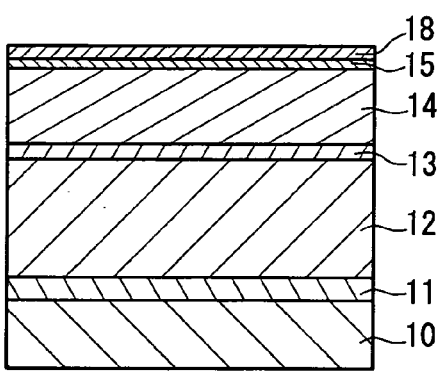

Next, as shown in FIG. 7B, a silicon oxide film 18 is deposited on the p-type GaInP protective layer 15, which is an uppermost layer of the layered body of the above layers. It may be deposited by, for example, thermal CVD (at atmospheric pressure, at 370° C.). The thickness thereof is 0.3 μm, for example.

Then, a region near each of the end faces of the silicon oxide film 18 (for example, a region that is 50 μm wide from each end face) is removed (not shown) so as to expose the p-type GaInP protective layer 15. Subsequently, impurity atoms such as Zn are thermally diffused into this exposed portions, thus disordering the region near each of the end faces of the active layer 13.

Figure 7C:
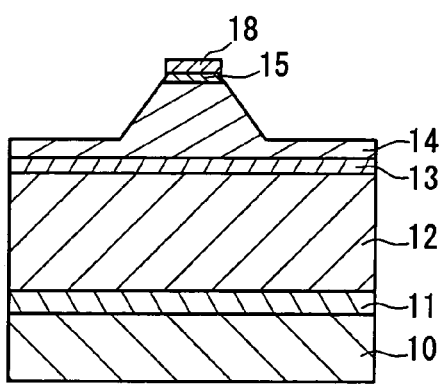

Thereafter, as shown in FIG. 7C, the silicon oxide film 18 is patterned into a predetermined shape. The patterning may be carried out by combining photolithography and dry etching, for example. For instance, the above-noted predetermined shape may be the same as the ridge shape in the semiconductor laser device illustrated in the first embodiment. In other words, it is appropriate to pattern the silicon oxide film 18 into the ridge shape shown in FIG. 3A or 3B, for example. Subsequently, using the patterned silicon oxide film 18 as a mask, the p-type GaInP protective layer 15 is etched selectively using a hydrochloric acid-based etchant or the like, and the p-type AlGaInP second cladding layer 14 is further etched selectively using a sulfuric acid-based etchant, a hydrochloric acid-based etchant or the like, thereby forming a mesa-shaped ridge.

Figure 7D:
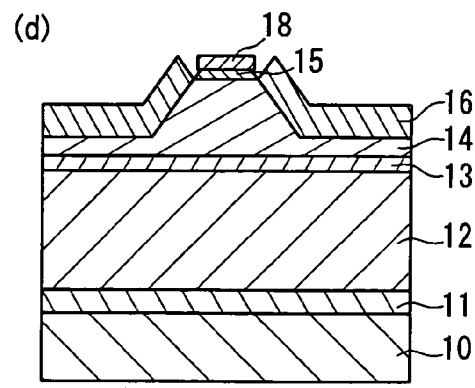

Next, as shown in FIG. 7D, using the silicon oxide film 18 as a mask, an n-type AlInP current blocking layer 16 is grown selectively on the p-type AlGaInP second cladding layer 14. The thickness thereof is, for example, 0.7 μm. The growing method may be MOCVD, for example.

Figure 7E:
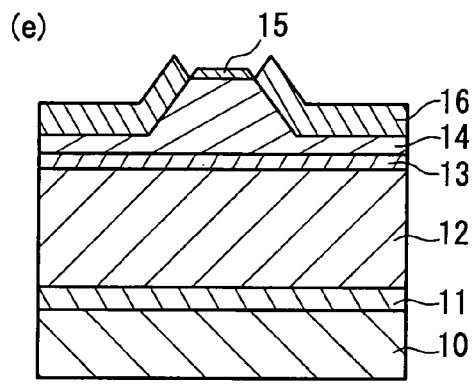
Figure 7F:
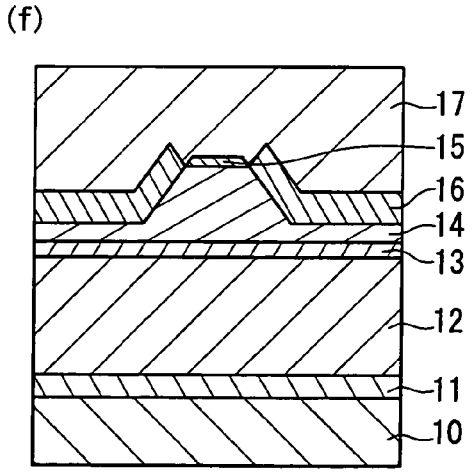

Then, as shown in FIG. 7E, the silicon oxide film 18 is removed using a hydrofluoric acid-based etchant or the like. Subsequently, as shown in FIG. 7F, a p-type GaAs contact layer 17 is deposited using MOCVD, MBE or the like. Finally, the device is cleaved into a desired resonator length, and then the front end face and the rear end face are coated with a dielectric film of amorphous Si, $SiO_2$, $Al_2O_3$ or the like so as to achieve a desired reflectivity.

Second Embodiment

An optical pickup apparatus in the second embodiment will be described with reference to FIGS. 8 and 9. The optical pickup apparatus of the present embodiment includes the semiconductor laser device in the above-described embodiment and a photodetector portion for receiving light that is emitted from the semiconductor laser device and then reflected by a recording medium.

Figure 8:
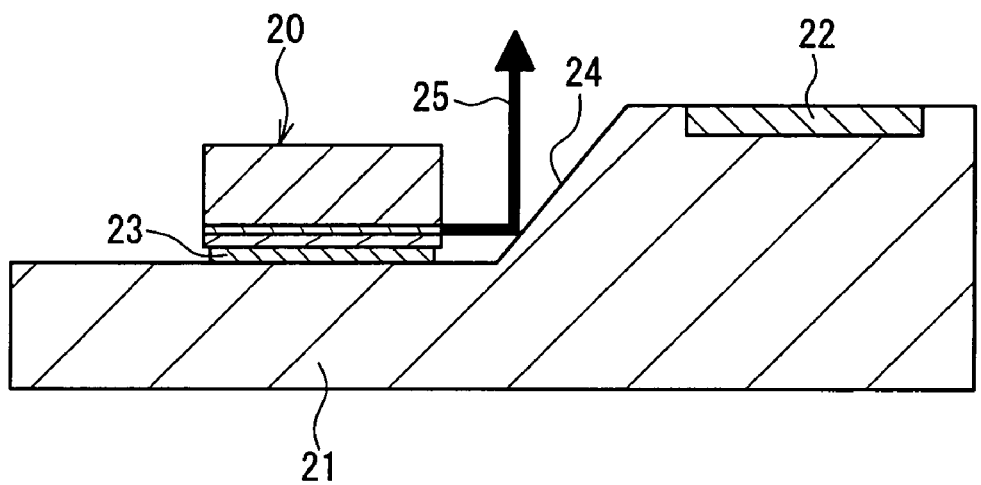
FIG. 8 is a sectional view showing an optical pickup apparatus according to a second embodiment of the present invention.

FIG. 8 is a sectional view showing an example of the optical pickup apparatus in the present embodiment. This optical pickup apparatus has a configuration in which a semiconductor laser device 20 is placed on a supporting substrate 21 and a photodetector element 22 is formed on the supporting substrate 21. The supporting substrate 21 has a step portion, and the semiconductor laser device 20 is fixed to a lower surface of this supporting substrate 21 via a base 23. An optical element 24 is formed on an inclined surface of the step portion. The photodetector element 22 is formed on a higher surface of the supporting substrate 21.

The optical element 24 reflects laser light 25 emitted from the semiconductor laser device 20 in a direction normal to the surface of the supporting substrate 21. The optical element 24 is formed by, for example, processing the surface of the supporting substrate 21 by wet etching such that a crystal orientation appears. The photodetector element 22 may be, for example, a photodiode. The semiconductor laser device 20 is disposed on the base 23 in order to suppress a reflection of the laser light 25 by the surface of the supporting substrate 21.

In this optical pickup apparatus, the photodetector portion 22 and the semiconductor laser device 20 serving as a light-emitting portion are integrated onto a single supporting substrate 21, making it easier to miniaturize an optical pickup apparatus. Furthermore, since the semiconductor laser device 20 achieves a stabilized optical axis of FFP (Far Field Pattern) and is capable of a fundamental transverse mode oscillation up to a high output state, it is suitable for an optical pickup apparatus that can be used with optical disks in various formats such as DVDs.

Figure 9:
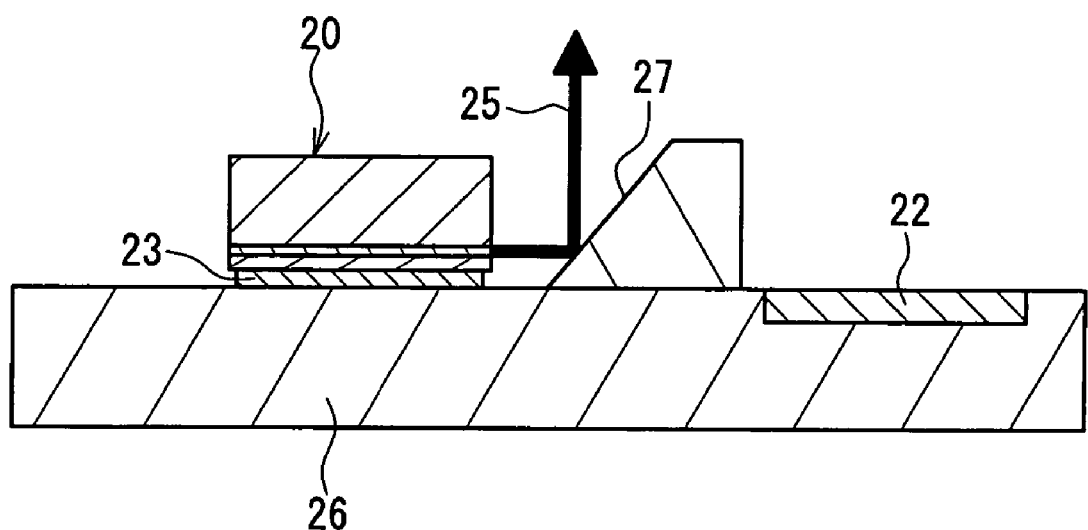
FIG. 9 is a sectional view showing an optical pickup apparatus having another structure according to the second embodiment of the present invention.
Figure 10:
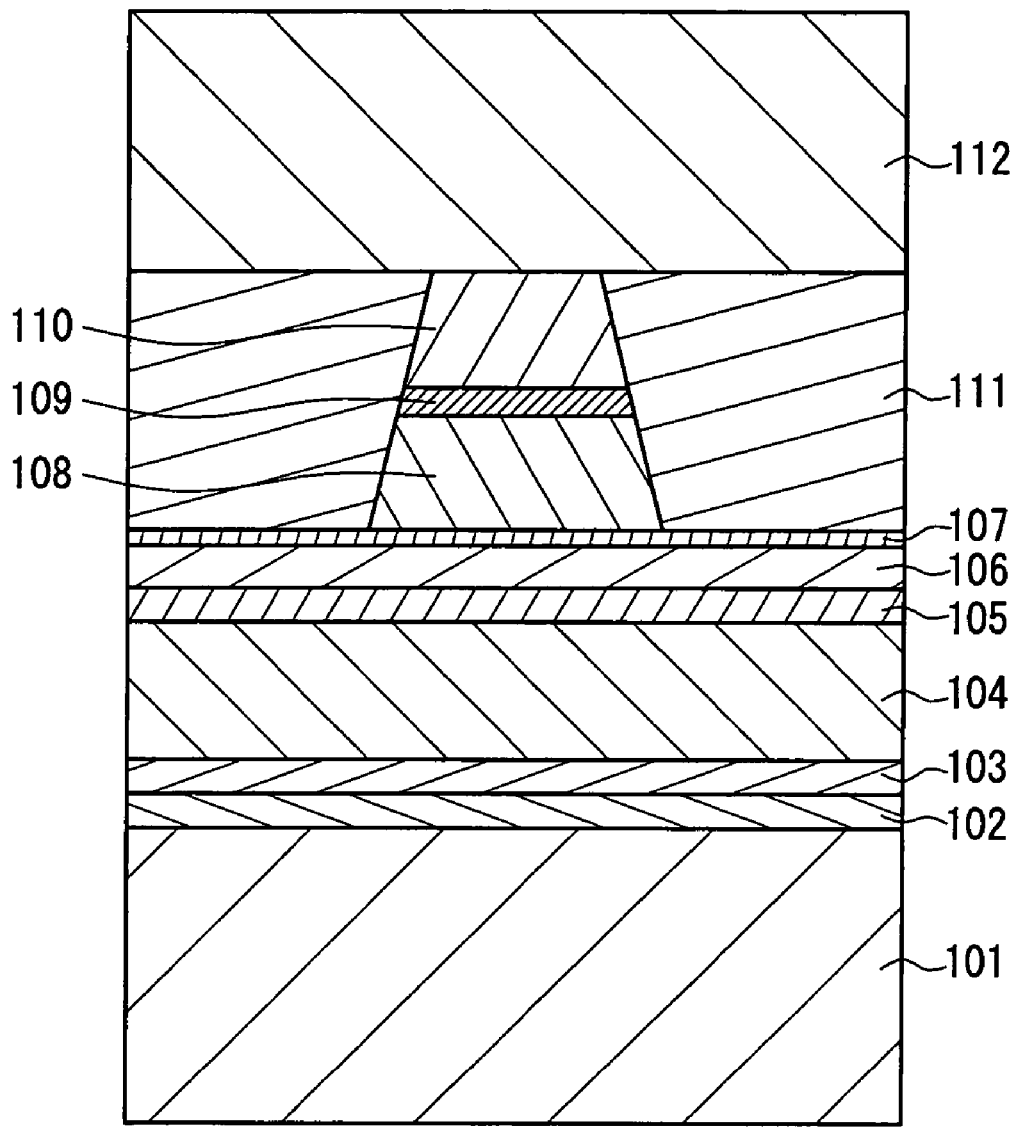
FIG. 10 is a sectional view showing a semiconductor laser device in a conventional example.

FIG. 9 is a sectional view showing another example of the optical pickup apparatus in the present embodiment. In this optical pickup apparatus, a substrate 26 has a flat surface, and the semiconductor laser device 20 is disposed on the same surface as that on which the photodetector element 22 is formed. A reflecting mirror 27 for reflecting the laser light 25 emitted from the semiconductor laser device 20 in a direction normal to the surface of the substrate 26 is disposed on the substrate 26 and between the semiconductor laser device 20 and the photodetector element 22. With such a configuration of the optical pickup apparatus, it is possible to obtain an effect similar to that of the optical pickup apparatus shown in FIG. 8.

As described above, with the configuration of the optical pickup apparatus according to the present embodiment, the optical axis of FFP is stabilized, allowing an operation in a fundamental transverse mode oscillation up to a high output state.

Also, the optical pickup apparatus in the present embodiment further may include a light-branching portion for branching the light reflected by the recording medium so that the photodetector portion receives the reflected light branched by the light-branching portion.

Moreover, the semiconductor laser device and the photodetector portion do not have to be disposed on a single substrate. However, it is more preferable that they are disposed on a single substrate because the optical pickup apparatus can be miniaturized further. Also, the optical element for reflecting the light emitted from the semiconductor laser device in the direction normal to the surface of the substrate need not be provided on the substrate.

Although the above embodiments were directed to an example of the GaAlInP semiconductor laser device, other compositions and structures also allow an application of the present invention as long as it is a ridge-waveguide type semiconductor laser device.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A semiconductor laser device having a striped structure for injecting carriers, comprising:
   a first electrically-conductive cladding layer;
   an active layer; and
   a second electrically-conductive cladding layer;

wherein the first electrically-conductive cladding layer, the active layer and the second electrically-conductive cladding layer are formed on a substrate, and a width of the stripe changes along a resonator direction, a difference between L1 and Lt is within 200 μm, and Rf<Rr, where L1 is a distance from a front end face to a position at which the width of the stripe is minimal, L is a length of a resonator of the semiconductor laser device, Rf is a reflectivity of the front end face, Rr is a reflectivity of a rear end face, and Lt is a distance expressed by L×$Log_e$(Rf)/$Log_e$(Rf×Rr), a width of the stripe at the rear end face is smaller than a width of the stripe at the front end face, and the width of the stripe at the rear end face ranges from 1.6 μm to 2.6 μm.

2. A semiconductor laser device having a striped structure for injecting carriers, comprising:

a first electrically-conductive cladding layer;

an active layer, and a second electrically-conductive cladding layer;

wherein the first electrically-conductive cladding layer, the active layer and the second electrically-conductive cladding layer are formed on a substrate, and the semiconductor laser device has a region in which a width of the stripe decreases continuously from a front end face to a rear end face, a difference between L1 and Lt is within 200 μm, and Rf<Rr, where L1 is a distance from the front end face to a position at which the width of the stripe is minimal in the region in which the width of the stripe decreases continuously, L is a length of a resonator of the semiconductor laser device, Rf is a reflectivity of the front end face, Rr is a reflectivity of the rear end face, and Lt is a distance expressed by L×$Log_e$(Rf)/$Log_e$(Rf×Rr), a width of the stripe at the rear end face is smaller than a width of the stripe at the front end face, and the width of the stripe at the rear end face ranges from 1.6 μm to 2.6 μm.

3. The semiconductor laser device according to claim 1, having regions near the front end face and the rear end face in which the width of the stripe is constant from the front end face and the rear end face to an inside of the resonator.

4. The semiconductor laser device according to claim 1, wherein the L1 is substantially equal to Lt.

5. The semiconductor laser device according to claim 1, wherein the active layer near at least one of the front end face and the rear end face is disordered by diffusing impurities.

6. An optical pickup apparatus comprising:

the semiconductor laser device according to claim 1; and a light-receiving portion for receiving light that is emitted from the semiconductor laser device and then reflected.

7. The optical pickup apparatus according to claim 6, further comprising a light-branching portion for branching the reflected light, wherein the light-receiving portion receives the reflected light branched by the light-branching portion.

8. The optical pickup apparatus according to claim 6, wherein the semiconductor laser device and the light-receiving portion are disposed on a single supporting substrate.

9. The optical pickup apparatus according to claim 6, wherein the semiconductor laser device is disposed on a supporting substrate, and an optical element is provided so as to reflect the light emitted from the semiconductor laser device in a direction normal to a surface of the supporting substrate.

10. The optical pickup apparatus according to claim 9, wherein the optical element is a reflecting mirror.

11. The semiconductor laser device according to claim 2, having regions near the front end face and the rear end face in which the width of the stripe is constant from the front end face and the rear end face to an inside of the resonator.

12. The semiconductor laser device according to claim 2, wherein the L1 is substantially equal to Lt.

13. The semiconductor laser device according to claim 2, wherein the active layer near at least one of the front end face and the rear end face is disordered by diffusing impurities.

14. An optical pickup apparatus comprising:

the semiconductor laser device according to claim 2; and a light-receiving portion for receiving light that is emitted from the semiconductor laser device and then reflected.

15. The semiconductor laser device according to claim 3, wherein a width of the stripe at the front end face ranges from 2.4 μm to 3 μm.

16. The semiconductor laser device according to claim 15, wherein a difference between the width of the stripe at the rear end face and the width of the stripe at the front end face is smaller than 0.5 μm.

17. The semiconductor laser device according to claim 1, wherein the difference between the effective refractive index inside the stripe and that outside the stripe is from $3\times10^{-3}$ to $7\times10^{-3}$.

18. The semiconductor laser device according to claim 11, wherein a width of the stripe at the front end face ranges from 2.4 μm to 3 μm.

19. The semiconductor laser device according to claim 18, wherein a difference between the width of the stripe at the rear end face and the width of the stripe at the front end face is smaller than 0.5 μm.

20. The semiconductor laser device according to claim 2, wherein the difference between the effective refractive index inside the stripe and that outside the stripe is from $3\times10^{-3}$ to $7\times10^{-3}$.

* * * * *